United States Patent
Okazaki

(10) Patent No.: US 7,028,236 B2
(45) Date of Patent: Apr. 11, 2006

(54) SEMICONDUCTOR MEMORY TESTING DEVICE

(75) Inventor: Tadashi Okazaki, Gunma (JP)

(73) Assignee: Advantest Corp., Tokyo (JP)

( * ) Notice: Subject to any disclaimer, the term of this patent is extended or adjusted under 35 U.S.C. 154(b) by 330 days.

(21) Appl. No.: 09/958,860

(22) PCT Filed: Dec. 6, 2000

(86) PCT No.: PCT/JP00/08628

§ 371 (c)(1),
(2), (4) Date: Apr. 1, 2002

(87) PCT Pub. No.: WO01/43141

PCT Pub. Date: Jun. 14, 2001

(65) Prior Publication Data

US 2003/0033557 A1    Feb. 13, 2003

(30) Foreign Application Priority Data

Dec. 7, 1999  (JP) ................................ 11/009266
Jan. 24, 2000  (JP) ............................ 2000-017897

(51) Int. Cl.
*G11C 29/00* (2006.01)
(52) U.S. Cl. ...................... 714/718; 714/48; 714/799; 365/201
(58) Field of Classification Search .............. 714/718, 714/719, 799, 48; 365/201
See application file for complete search history.

(56) References Cited

U.S. PATENT DOCUMENTS 5,412,662 A * 5/1995 Honma et al. ............... 714/718
5,604,756 A * 2/1997 Kawata ....................... 714/773
5,646,948 A * 7/1997 Kobayashi et al. .......... 714/719
5,673,271 A * 9/1997 Ohsawa ...................... 714/718

FOREIGN PATENT DOCUMENTS

| JP | 7-130200 | 5/1995 |
| JP | 7-192497 | 7/1995 |
| JP | 8-55498 | 2/1996 |

* cited by examiner

*Primary Examiner*—Albert Decady
*Assistant Examiner*—John P. Trimmings
(74) *Attorney, Agent, or Firm*—Muramatsu & Associates

(57) ABSTRACT

This invention provides a semiconductor memory test system in which the test system will not conduct logic comparison for a particular memory block after a failure is detected in the block. The test system which tests writing and erasing as a unit of block in the memory under test. The test system includes a register provided for each memory under test for holding a first failure generated in a particular block at a first control signal from a pattern generator, establishes a pass result for the particular block for test cycles after the first failure, thereby treating any failure result for the particular block as the pass result thereafter; and resets the register at a cycle specified by a second control signal from the pattern generator to release the pass result.

4 Claims, 5 Drawing Sheets

SEMICONDUCTOR MEMORY TESTING DEVICE

FILED OF THE INVENTION

The present invention relates to a semiconductor memory test system which is capable of reducing a test time for testing semiconductor memory devices such as flash memories.

BACKGROUND OF THE INVENTION

An example of the conventional technology regarding such semiconductor memory test system will be explained with reference to FIGS. 3-5. As shown in FIG. 3, the main components of the conventional semiconductor memory test system include a timing generator 10, a pattern generator 20, a wave formatter 30, and a logic comparator 40. Peripheral devices and a tester processor are, however, abbreviated in the drawing for simplicity.

Under this arrangement, the tests for MUT1-MUTn, which are memory devices under test, are conducted by executing the test program. Normally, the semiconductor memory test system tests several memory devices simultaneously in order to improve production efficiency.

The timing generator 10 generates a reference clock and a strobe timing signal. Pursuant to the test program produced in advance, the pattern generator 20 outputs an address signal ADRS, a write data signal WD, a control signal CS, and expected value data ED, which are synchronized with the reference clock from the timing generator 10.

The wave formatter 30 receives the address signal ADRS, the write data signal WD, and the control signal CS from the pattern generator 20 to format the waveforms into test signals, and supplies the test signals to the memories under test MUT1-MUTn. The write and read operation of the test data for the memory devices under test MUT1-MUTn is controlled by the control signal CS.

The logic comparator 40 detects whether there is a match between the data read from the memory devices under test MUT1-MUTn at the timing of the strobe signal STRB from timing generator 10 and the expected value data. The logic comparator 40 determines the pass/fail of the memories devices under test MUT1-MUTn based on the result of the comparison at the cycle of CPE="1".

Next, the operation of the logic comparator 40 will be explained with reference to FIG. 4 which shows the basic circuit structure of the logic comparator.

Normally, the logic comparator 40 includes logic comparison circuits 41-4n which correspond to the memory devices under test MUT1-MUTn. Although each of the logic comparison circuits 41-4n in FIG. 4 includes a comparison circuit corresponding to each data bit of the MUT, the data bits here is expressed as one bit in order to simplify the diagram.

In the logic comparison circuit 4n, the test data signal RDn that has been read out from MUTn is latched by a register 60 at the timing of the strobe signal STRB from the timing generator. An EXNOR (exclusive NOR) gate 70 detects whether there is a match between the latched data from the register 60 and the expected value data EXP from the pattern generator. When there is a match, the EXNOR gate 70 generates a match detection signal "1".

The logic comparison (for determining pass or fail) is conducted by an AND gate 73 at the timing of the CPE signal and the match detection signal noted above provided through an inverter 71. When a mismatch is detected in the cycle of CPE="1", the logic comparison circuit determines a failure and outputs a fail detection signal FAIL="1". When all the data read out from the memory devices under test MUT1-MUTn match the expected value data, a match flag signal MF is produced by an AND gate 90 and is provided to the pattern generator 20.

Next, the process of testing a flash memory will be explained in the following.

When testing a flash memory, because of its operational principle, data cannot always be set in the target memory cell by one writing or erasing action. Rather, ordinarily, a flash memory requires writing actions or erasing actions of several times. Then, in the memory cell where the writing or erasing operation has been correctly conducted, the memory is so designed that excess writing and erasing actions, which are additional writing and erasing motions with respect to the successful memory cell, are no longer allowed. Further, the required number required for writing or erasing actions varies depending on, such as, the addresses of the flash memory.

One of the types of flash memories having the above characteristic is called a NAND type flash memory. In the NAND flash memory, the internal cells are structured as a unit of page where the writing action is conducted as a unit of page. For example, as shown in FIG. 5, in the memory having memory cells of 1,024 rows by 4,224 columns, each row is considered as one page. Thus, the memory having 1,024 pages is structured from page 1 to page 1,023.

Further, the erasing action in the NAND type flash memory is conducted by a unit of block which is a group of consecutive pages. For example, in the example shown in FIG. 5, four (4) pages of memory cell constitute one block, thus, the flash memory is structured by 0–255 blocks.

In testing a NAND type flash memory having the above characteristic, a match function is used. In the match function, sequence control of the test pattern generation is conducted based on the result of the match signal explained above. When one memory MUT out of plural memories under test MUT1-MUTn shows a mismatch, writing and erasing test is conducted once again with that address of the MUT. At this time, in order to avoid the excess writing and erasing actions towards the MUT's addresses showing the match, a write enable signal to the MUTs is prohibited.

When all the memory devices under test MUT1-MUTn are matched with the expected data, the operation then moves on to the next addresses and begins conducting another writing and erasing test. When mismatch is repeated in the same memory cell for more than a predetermined number of times, the memory under test MUT is determined defective. When the data writing and erasing tests are correctly conducted for all of memory cells of the addresses within the specified number of times, the MUTs will be considered non-defective.

In the NAND type flash memory, when the number of defective blocks is smaller than a predetermined number, the flash memory is considered non-defective, even though a defective block exists therein. This is because a user of the memory recognizes that there are defective blocks in the NAND type flash memory in advance so that he can arrange his design in such a way that the defective blocks will not be used.

Incidentally, when determining the quality of the NAND type flash memory, once a mismatch is detected for a target block of the memory, this block is determined as defective. Thus, there is no need to further continue a logic comparison procedure for the block thereafter. However, the conventional semiconductor memory test system does not includes such a function, therefore, it will continue the logic comparison using the match function even after the defective block is recognized.

Since the conventional semiconductor memory test system continues the logic comparison with use of the match function even after detecting the defective block in the flash memory, a problem arises that unnecessary test times have to be spent in the test.

SUMMARY OF THE INVENTION

Therefore, in order to solve the above noted problem, it is an object of the present invention to provide a semiconductor memory test system in which, during the test for each unit of block in a flash memory, the test system will not further conduct logic comparison for a target block after a failure is detected in the block.

Namely, the present invention for achieving the above object is a semiconductor memory test system characterized in that the test system comprising a register provided for each memory device under test for holding a first failure generated in a particular block of a memory under test at a first control signal from a pattern generator; establishing a match condition, a pass condition, and a write inhibit condition for the particular block for test cycles after the first failure; and resetting the register at a cycle specified by a second control signal from the pattern generator to release the match condition, pass condition, and write inhibit condition.

Further, the present invention is a semiconductor memory test system for testing a plurality of memory devices under test (MUT) by using a match function where sequence control of test patterns are conducted based on the matched results between an output signal of each MUT and an expected value signal from the pattern generator. The semiconductor memory test system is characterized in comprising a register provided for each memory device under test for holding a first failure generated in a particular block at a first control signal from a pattern generator; establishing a match condition, a pass condition, and a write inhibit condition for the particular block for a test cycle after the first failure; and resetting the register at a cycle specified by a second control signal from the pattern generator to release the match condition, pass condition, and write inhibit condition.

Further, in the semiconductor test system of the present invention, the above mentioned first control signal and second control signal are produced by the pattern generator based on the test pattern program produced in advance.

Further, in the semiconductor memory test system of the present invention, the memory device under test is a flash memory where the data writing action and data erasing action of several times for the same addresses are tested as a unit of block.

DETAILED DESCRIPTION OF THE INVENTION

The present invention will be explained with reference to the embodiments in the following. The embodiment of the present invention will be explained with reference to FIGS. 1 and 2.

Figure 1:
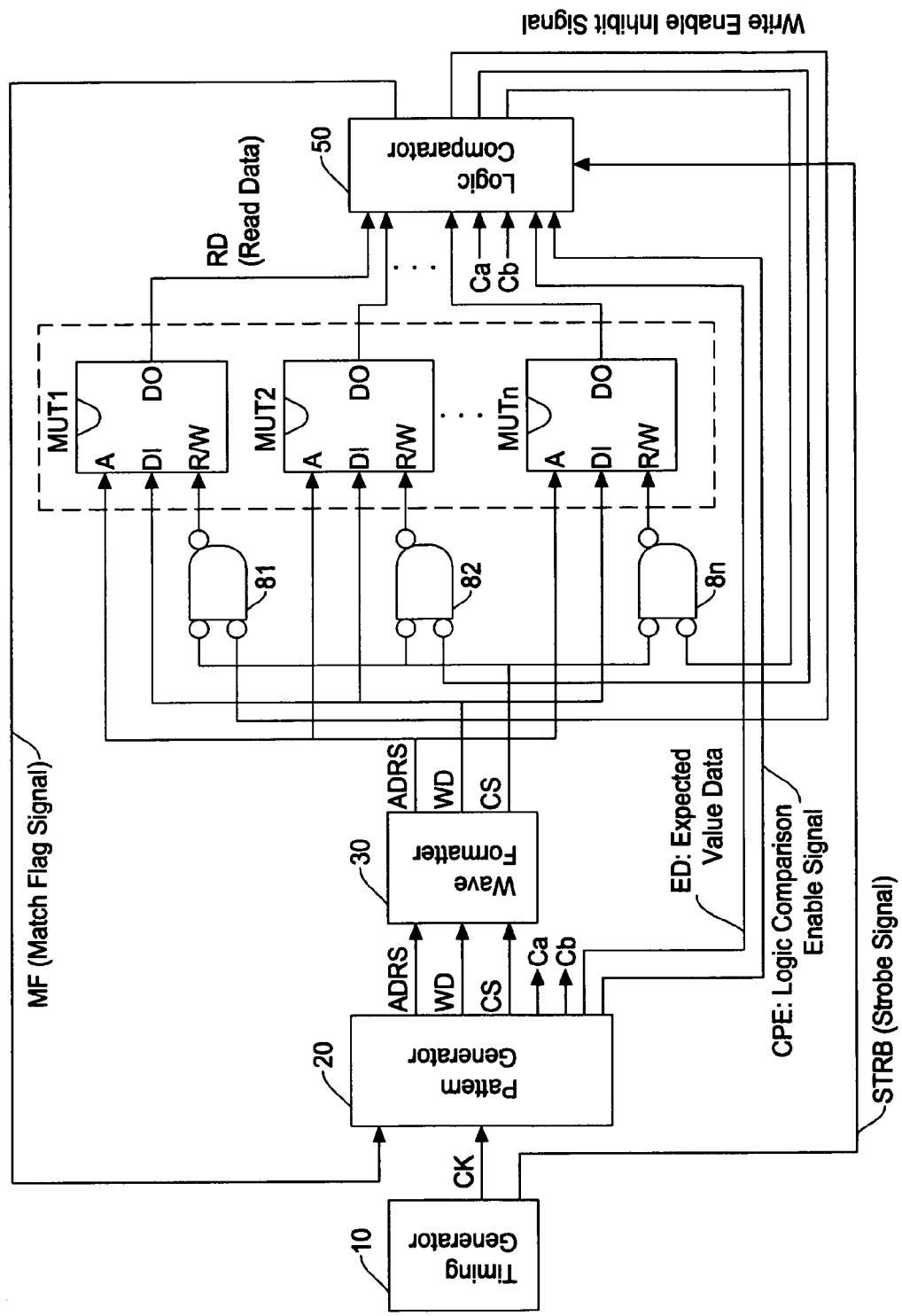
FIG. 1 is a block diagram of the semiconductor memory test system of the present invention.

As shown in FIG. 1, the semiconductor memory test system of the present invention is comprised of a timing generator 10, a pattern generator 20, a wave formatter 30, a logic comparator 50, and AND gates 81–8$n$. However, peripheral devices and a tester processor, as in the explanation of the conventional technology, will be abbreviated in order to make the diagrams simple. In addition, since the timing generator 10, the pattern generator 20, and the wave formatter 30 are the same as those in the conventional technology, the explanation of these units will be omitted as well.

The logic comparator 50 conducts a match function by detecting whether there is a match between the data from the memory devices under test MUT1-MUT$n$ and the expected value data at the timing of the strobe signals STRB from the timing generator 10, and determines pass/fail of the memory devices under test MUT1-MUT$n$ based on the match results at a cycle of CPE="1".

Figure 2:
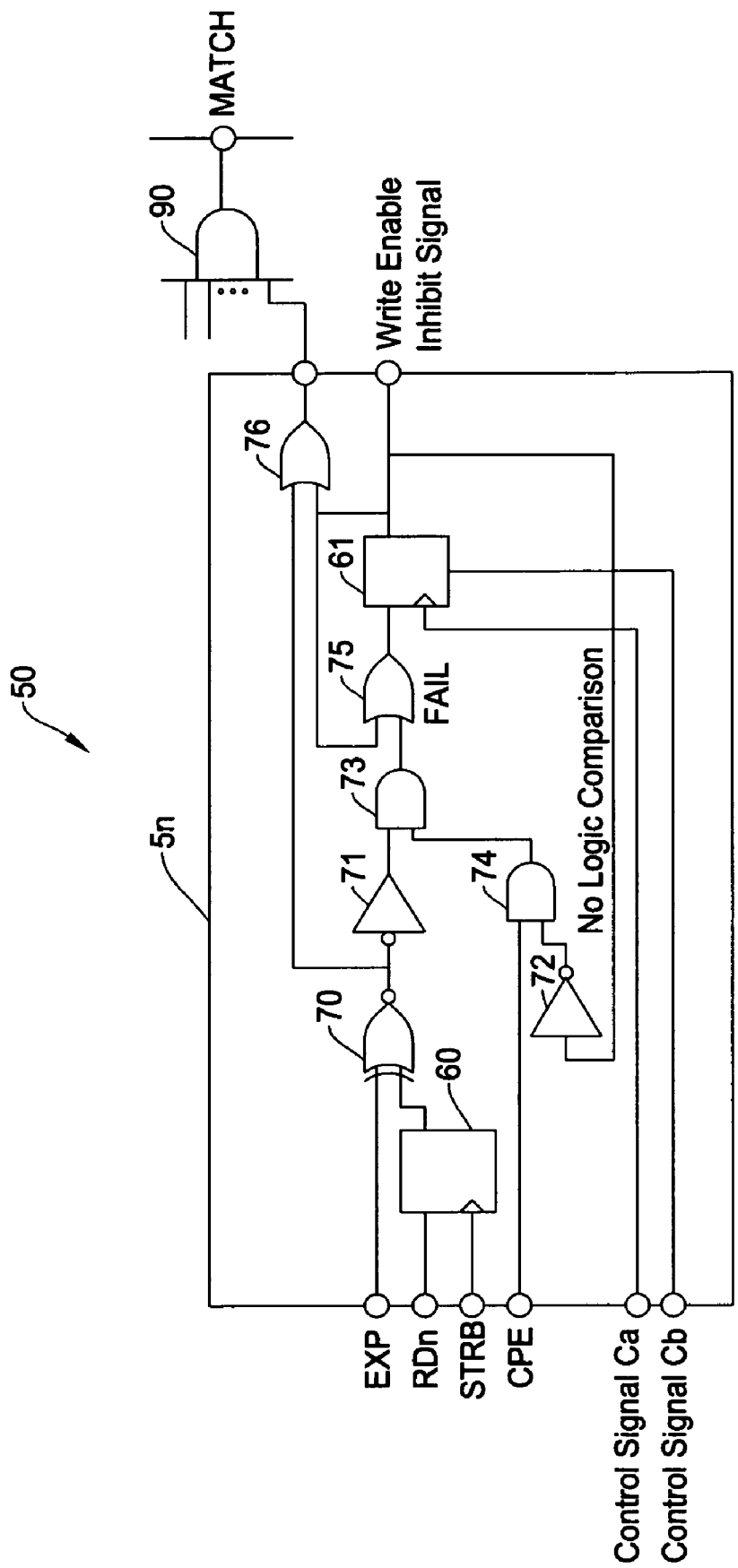
FIG. 2 is a circuit diagram of the logic comparison circuit in the semiconductor memory test system of the present invention.
Figure 3:
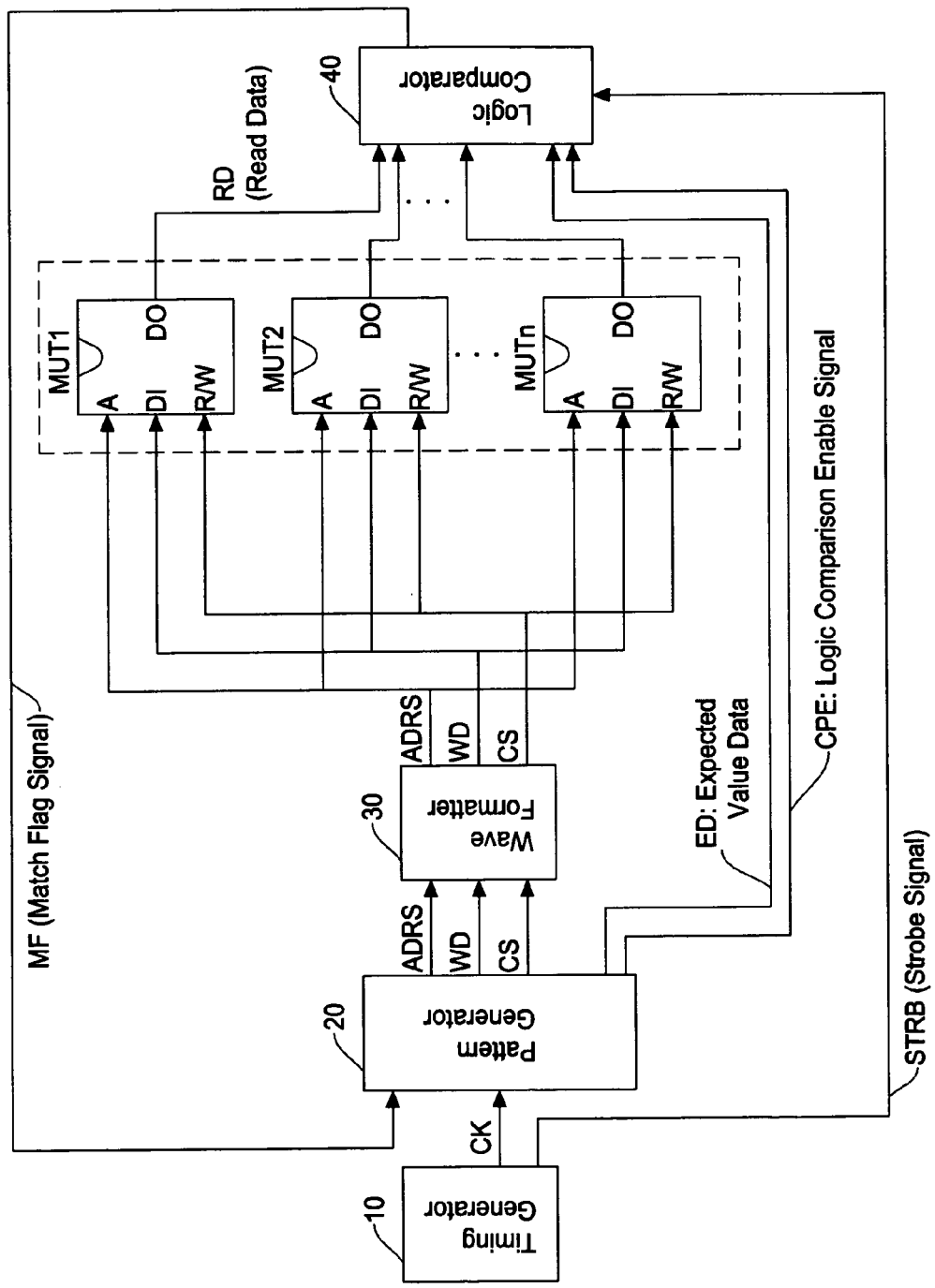
FIG. 3 is a block diagram of the conventional semiconductor memory test system.
Figure 4:
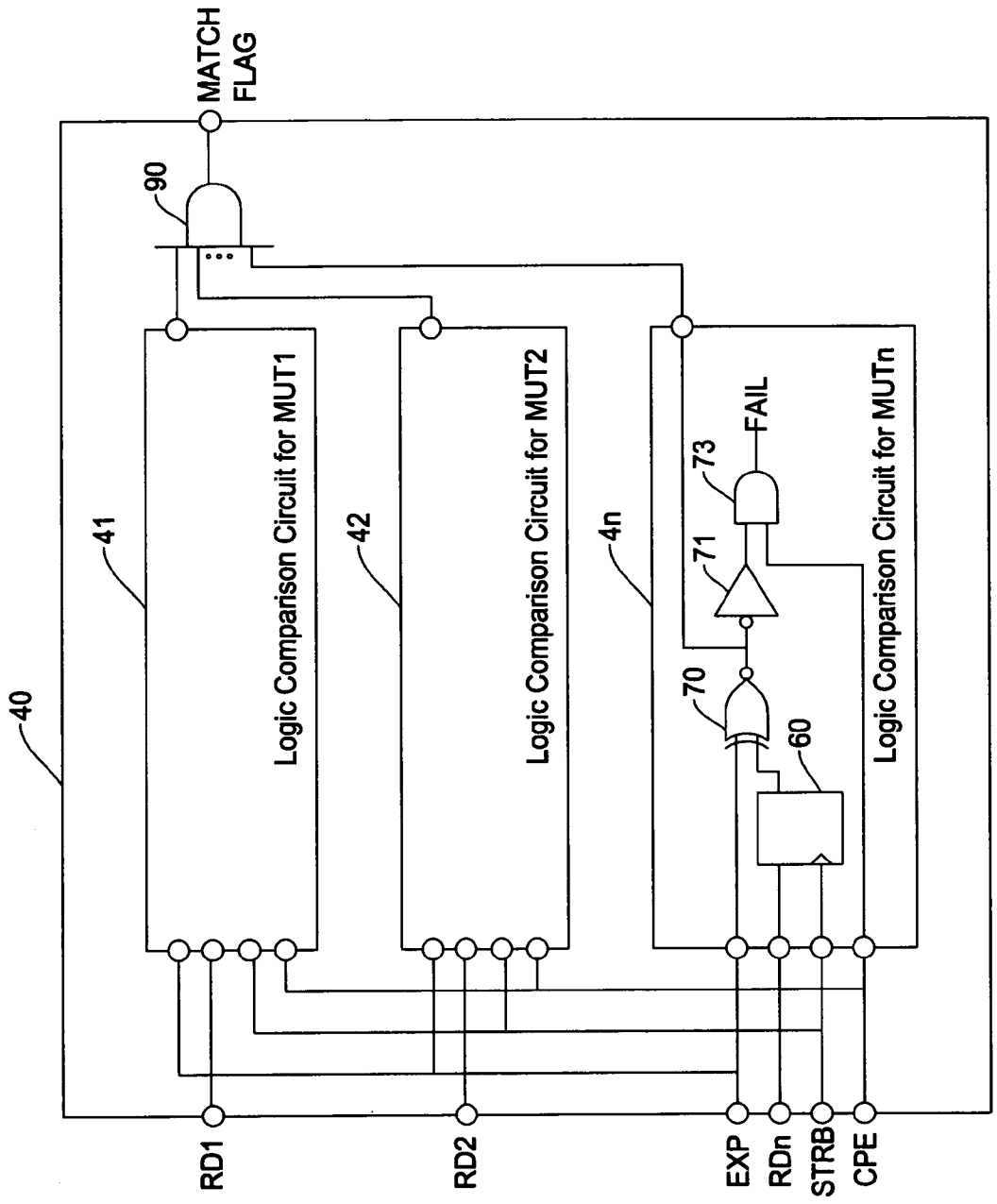
FIG. 4 is a circuit diagram of the logic comparison circuit in the conventional semiconductor memory test system.
Figure 5:
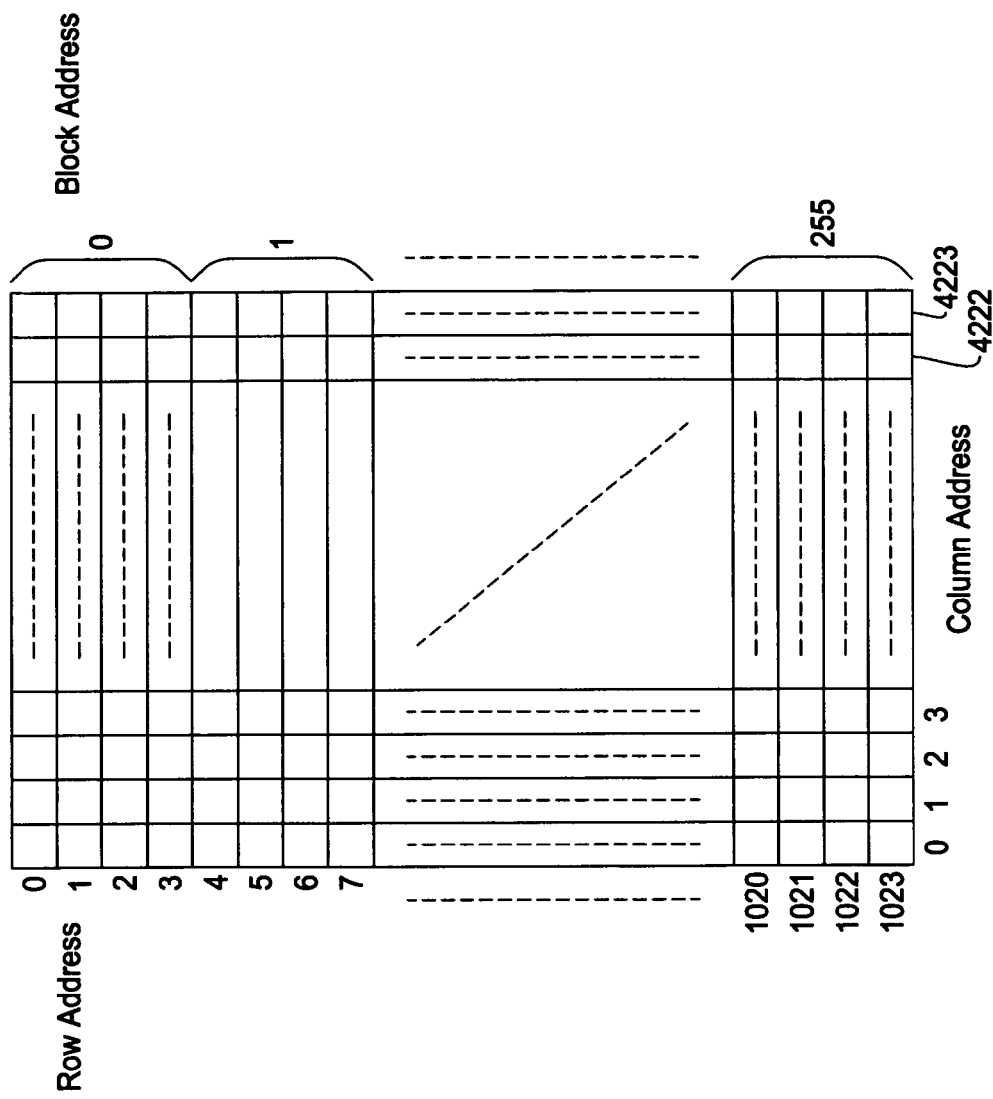
FIG. 5 is a block diagram showing a structure in a flash memory.

Next, the operation of the logic comparator 50 will be explained with reference to FIG. 2. Normally, the logic comparator 50 is formed with logic comparison circuits 51–5$n$, which correspond to the memory devices under test MUT1-MUT$n$. In FIG. 2, however, since each of the logic comparison circuits has the same structure, FIG. 2 shows only the logic comparison circuit 5$n$.

Further, the logic comparison circuit 5$n$ handles the same amount of data bits as in the MUT, however, the data bit will be displayed as one bit in order to make the diagrams simple. In the logic comparison circuit 5$n$, the test data signal RD$n$ which is read out from memory under test MUT$n$ is latched in a register 60 by the timing of the strobe signal STRB from the timing generator. The latched data is compared with the expected value data EXP from the pattern generator by the EXNOR gate 70 at the strobe signal STRB, where a match detection signal "1" is output upon finding a match therebetween.

The logic comparison (for determining pass or fail) is conducted by an AND gate 73 by the timing of a CPE signal and the match detection signal mentioned above. The match detection signal is provided to the AND gate 73 through an inverter 71 and the CPE signal is provided to the AND gate through an AND gate 74. When a mismatch is detected in the cycle of CPE="1", the logic comparison circuit determines a failure and outputs a failure detection signal FAIL="1".

Further, the failure detection signal FAIL is provided to a hold register 61 through an OR gate 75, where the failure detection signal is loaded therein by a control signal Ca. Once the failure signal is loaded by the control signal Ca, the output of the hold register 61 is returned to the input of the OR gate 75. Therefore, an attempt to load the pass condition in the cycles thereafter is invalidated, thereby maintaining the failure condition in the hold register 61.

Thus, once the failure is loaded by the control signal Ca, the output from the hold register 61 is provided to the AND gate 74 through an inverter 72 to act as a logic comparison inhibit signal (logic "0" at the input of AND gate 74) thereby prohibiting the CPE signal to the AND gate 73. Accordingly, the AND gate 73 which logically compares the match output of EXNOR gate 70 is set to a pass condition.

Further, since the output of the hold register 61 is connected to an input of an OR gate 76, a match signal of MUTn is maintained as "1" which is input to an AND gate 90 connected to the pattern generator 20. Therefore, when the failure is generated in a particular block of the memory under test, the match condition will be maintained thereafter with respect to that memory block. Further, the output of the hold register 61 also acts as a write enable inhibit signal, and as shown in FIG. 1, is provided to an AND gate 8n, thereby prohibiting the writing operation of the MUTn. Here, the control signals Ca and Cb transmitted from the pattern generator 20 can be generated at arbitrary cycles by programming, in advance, their timings in the test pattern.

The flash memory testing by the semiconductor test system of the present invention is explained in the following.

In the flash memory testing, in the logic comparison cycle within the writing and erasing test for each test block, the control signal Ca is generated and when a failure is generated in a memory cell within a particular block, the match condition for the memory device under test is mandatorily maintained so as to produce a pass result in the logic comparison and the writing operation thereafter is prohibited.

In addition, before proceeding to the next block, the control signal Cb is generated at the end of each block to reset the hold register 61 to be prepared for the test on the next block.

The present invention is implemented in the manner explained in the foregoing, thereby achieving the following effects.

Namely, in the semiconductor memory test system of the present invention, when a failure is detected with respect to a particular memory block, a match condition is maintained for that block to prohibit any further writing or erasing operations for the block, resulting in the reduction of the test time.

What is claimed is:

1. A semiconductor memory test system for testing a memory device which writes and reads data as a unit of memory block, comprising:

a register provided for each memory device under test for holding a first failure generated in a particular block in the memory device under test at a first control signal from a pattern generator;

means for establishing a pass result for the particular block in response to the first failure for remaining test cycles, thereby treating any failure result for the particular block as the pass result thereafter; and means for resetting the register at a cycle specified by a second control signal from the pattern generator to release the pass result.

2. A semiconductor memory test system for testing a plurality of memory devices under test by applying test patterns to the memory devices under test and evaluating resultant output signals of the memory devices under test, comprising:

means for detecting a match between the output signals and expected value signals where sequence control of the test patterns is made based on results of match between the output signal of each memory device under test and an expected value signal from a pattern generator;

a register provided for each memory device under test for holding a first failure generated in a particular block at a first control signal from the pattern generator;

means for establishing a pass result for the particular block for remaining test cycles after detecting the first failure, thereby treating any failure result for the particular block as the pass result thereafter; and means for resetting the register at a cycle specified by a second control signal from the pattern generator to release the pass result.

3. The semiconductor test system as defined in claim 2, wherein the first control signal and the second control signal are produced by the pattern generator based on test patterns programmed in advance.

4. The semiconductor test system as defined in claim 2, wherein each memory device under test is a flash memory where data writing and erasing actions of several times for the same addresses are tested as a unit of block.

* * * * *